(12) United States Patent
Kamimura

(10) Patent No.: US 6,445,207 B1
(45) Date of Patent: Sep. 3, 2002

(54) IC TESTER AND IC TEST METHOD

(75) Inventor: Shigehiro Kamimura, Kanagawa (JP)

(73) Assignee: Ando Electric Co., Ltd., Kanagawa (JP)

( * ) Notice: Subject to any disclaimer, the term of this patent is extended or adjusted under 35 U.S.C. 154(b) by 34 days.

(21) Appl. No.: 09/713,927

(22) Filed: Nov. 16, 2000

(30) Foreign Application Priority Data

Nov. 29, 1999 (JP) ............................................. 11-338534

(51) Int. Cl.[7] .............................................. G01R 31/26
(52) U.S. Cl. ................................... 324/765; 324/158.1
(58) Field of Search ............................ 324/73.1, 158.1, 324/765; 714/712, 724, 736, 738; 702/117, 119

(56) References Cited

U.S. PATENT DOCUMENTS

| 5,018,145 A | * | 5/1991 | Kikuchi et al. | ............. 714/743 |
| 5,432,797 A | * | 7/1995 | Takano | ........................ 714/718 |
| 6,232,759 B1 | * | 5/2001 | Wohlfarth | .................. 324/73.1 |
| 6,255,843 B1 | * | 7/2001 | Kurihara | ..................... 324/765 |

* cited by examiner

Primary Examiner—Michael Sherry
Assistant Examiner—Minh N. Tang
(74) Attorney, Agent, or Firm—Fish & Richardson P.C.

(57) ABSTRACT

A control processor 1 stores a power supply current acquisition start address in a storage circuit 21 and a power supply current acquisition end address in a storage circuit 22. When a pattern generation address signal input from a pattern generator 2 matches the power supply current acquisition start address, a match detection circuit 23, 24 sets a flip-flop 6; when the pattern generation address signal matches the power supply current acquisition end address, the match detection circuit 23, 24 resets the flip-flop 6. An AND gate 7 outputs a clock signal to an AD converter 8 only while the flip-flop is set, and the AD converter 8 converts a current signal into a digital signal and outputs the digital signal to a storage circuit 9.

8 Claims, 2 Drawing Sheets

IC TESTER AND IC TEST METHOD

BACKGROUND OF THE INVENTION

This invention relates to an IC tester and an IC test method for determining whether or not a measured IC is good by conducting a frequency analysis of a power supply current.

In recent years, putting circuits used with various electronic machines into ICs (integrated circuits) has been proceeding rapidly. However, variations in characteristics of ICs to some extent easily occur at the mass production time and thus an IC tester for testing an IC is used. Known as one of the IC testers for testing ICs is an IC tester for conducting frequency analysis of a power supply current of an IC when a predetermined test pattern signal is input and determining whether or not the IC is good based on the analysis result, for example.

Such an IC tester for conducting a frequency analysis of a power supply current of an IC in a related art is made up of a control processor 1, a pattern generator 2, a voltage generation/current detection circuit 4, a sampling clock generation circuit 5, a flip-flop 6, an AND gate 7, an AD converter 8, a storage circuit 9, and a high-speed computation circuit 10, as shown in FIG. 2.

The control processor 1 sets a voltage value in the voltage generation/current detection circuit 4 and outputs pattern data to the pattern generator 2. It outputs a frequency control signal to the sampling clock generation circuit 5 and outputs a computation control signal to the high-speed computation circuit 10. The control processor 1 compares the frequency analysis result input from the high-speed computation circuit 10 with a predetermined standard value and determines whether or not a measured sample 3 is good.

The pattern generator 2 generates a digital pattern signal in accordance with the pattern data input from the control processor 1 and outputs the generated pattern signal to the measured sample 3. When the pattern generator 2 starts to generate the digital pattern signal, it outputs a pattern generation start signal to an S terminal of the flip-flop 6 for setting the flip-flop 6. Further, when the pattern generator 2 terminates generating the digital pattern signal, it outputs a pattern generation termination signal to an R terminal of the flip-flop 6 for resetting the flip-flop 6.

The measured sample 3 is an IC to be tested and when a power supply voltage is input from the voltage generation/current detection circuit 4 and the pattern signal is input from the pattern generator 2, the measured sample 3 outputs a current signal changed in response to the pattern signal to the voltage generation/current detection circuit 4.

The voltage generation/current detection circuit 4 applies the voltage set by the control processor 1 to a power terminal of the measured sample 3. It detects a current signal responsive to the power supply current flowing into the measured sample 3 and outputs the detected current signal to the AD converter 8.

When the pattern generation start signal is input to the S (Set) terminal of the flip-flop 6 from the pattern generator 2, the flip-flop 6 outputs "1" to the AND gate 7 and continues to output "1" until the pattern generation termination signal is input to the R (Reset) terminal. When the pattern generation termination signal is input to the R terminal from the pattern generator 2, the flip-flop 6 outputs "0" to the AND gate 7 and continues to output "0" until the pattern generation start signal is input to the S terminal. That is, while the pattern signal is input to the measured sample 3 from the pattern generator 2, the flip-flop 6 outputs "1" to the AND gate 7; otherwise the flip-flop 6 outputs "0."

The sampling clock generation circuit 5 generates a clock signal of a frequency responsive to the frequency control signal from the control processor 1 and outputs the clock signal to the AND gate 7. The AND gate 7 outputs the clock signal input from the sampling clock generation circuit 5 to the AD converter 8 only while "1" is input from the flip-flop 6.

Only while the clock signal is input from the AND gate 7, the AD (Analog to Digital) converter 8 converts the current signal input from the voltage generation/current detection circuit 4 into a digital signal in synchronization with the clock signal, and outputs the electric current converted into the digital signal to the storage circuit 9.

The storage circuit 9 stores the current signal input from the AD converter 8 and outputs the current signal to the high-speed computation circuit 10, which then conducts a frequency analysis of the current signal input from the storage circuit 9 in accordance with the computation control signal input from the control processor 1 and outputs the analysis result to the control processor 1, which then determines whether or not the measured sample 3 is good based on the analysis result. That is, frequency analysis of the current signal detected by the voltage generation/current detection circuit 4 while the pattern signal is input to the measured sample 3 is conducted and whether or not the measured sample 3 is good is determined.

To detect minute current fluctuation with good accuracy and conduct a frequency analysis with the IC tester in the related art as shown in FIG. 2, the noise component superposed on the detected current signal must be removed. Thus, for example, the same pattern signal is input to the measured sample 3 repeatedly n times and the digital signal into which the current signal is converted by the AD converter 8 is stored in the storage circuit 9 each time, then the average value of n digital signals stored is calculated, whereby the noise component is removed and then a frequency analysis is conducted.

However, when the same pattern signal is input repeatedly, some measured samples 3 must be initialized each time one pattern signal is input, and a pattern for initializing the measured sample 3 must be contained in the beginning of the pattern signal in some cases. In these cases, the IC tester in the related art cannot conduct a frequency analysis of only the current signal responsive to the test pattern signal excluding the current signal responsive to the pattern signal for initializing the measured sample 3; this is a problem. Thus, with the IC tester in the related art, the test pattern signal input to the measured sample 3 must be changed.

For example, if the pattern signal must be changed for each of the circuit blocks making up the measured sample 3, the operation of inputting the pattern signal responsive to one circuit block to the measured sample 3, storing the current signal detected at the time in the storage circuit 9, and conducting a frequency analysis by the high-speed computation circuit 10 must be repeated for each circuit block.

SUMMARY OF THE INVENTION

Techniques for testing integrated circuits (ICs) using frequency analysis are disclosed.

According to one aspect, an IC test method uses frequency analysis of a power supply current fluctuating in response to a test pattern signal input to an IC. The method includes storing a start address and an end address of the test pattern signal input to the IC and storing only power supply current from the IC that is detected while the pattern specified by the start address and the end address is input to the IC. A frequency analysis of the stored power supply current is conducted and a determination is made as to whether or not the IC is good based on an analysis result of the frequency analysis.

Some implementations may include one or more of the following features. For example, an address signal of the test pattern signal input to the IC may be generated. Matches between the address signal and the start address and the end address may he detected so that only power supply current detected in a time interval from a time when the match between the address signal and the start address is detected until a time when the match between the address signal and the end address is detected. In some cases, multiple start addresses and end addresses may be stored.

An apparatus for implementing the foregoing techniques also is disclosed.

Therefore, if the pattern signal contains a plurality of pattern signal portions required for test, the plurality of pattern signal portions can be specified and the power supply currents of the IC based on the pattern signal portions required for test can be stored for conducting a frequency analysis.

Thus, for example, if the pattern signal must be changed for each of the circuit blocks making up the IC, the pattern signal containing all of the pattern signals responsive to the circuit blocks is input to the IC only once, whereby the power supply current responsive to the pattern signal varying from one circuit block to another can be stored in the storage circuit 9 and whether or not the IC is good can be determined based on the frequency analysis result, so that test can be carried out more easily without changing the pattern signal input to the IC.

For example, if a frequency analysis is conducted after the noise component of each power supply current is removed by detecting and averaging a plurality of power supply currents based on the same test pattern, one pattern signal comprising a plurality of patterns for initializing the IC and a plurality of patterns required for testing in succession is input to the IC only once, whereby a plurality of only power supply currents based on the test pattern portions can be stored, so that test can be carried out more easily without changing the pattern signal input to the IC.

DETAILED DESCRIPTION OF THE PREFERRED EMBODIMENTS

Figure 1:
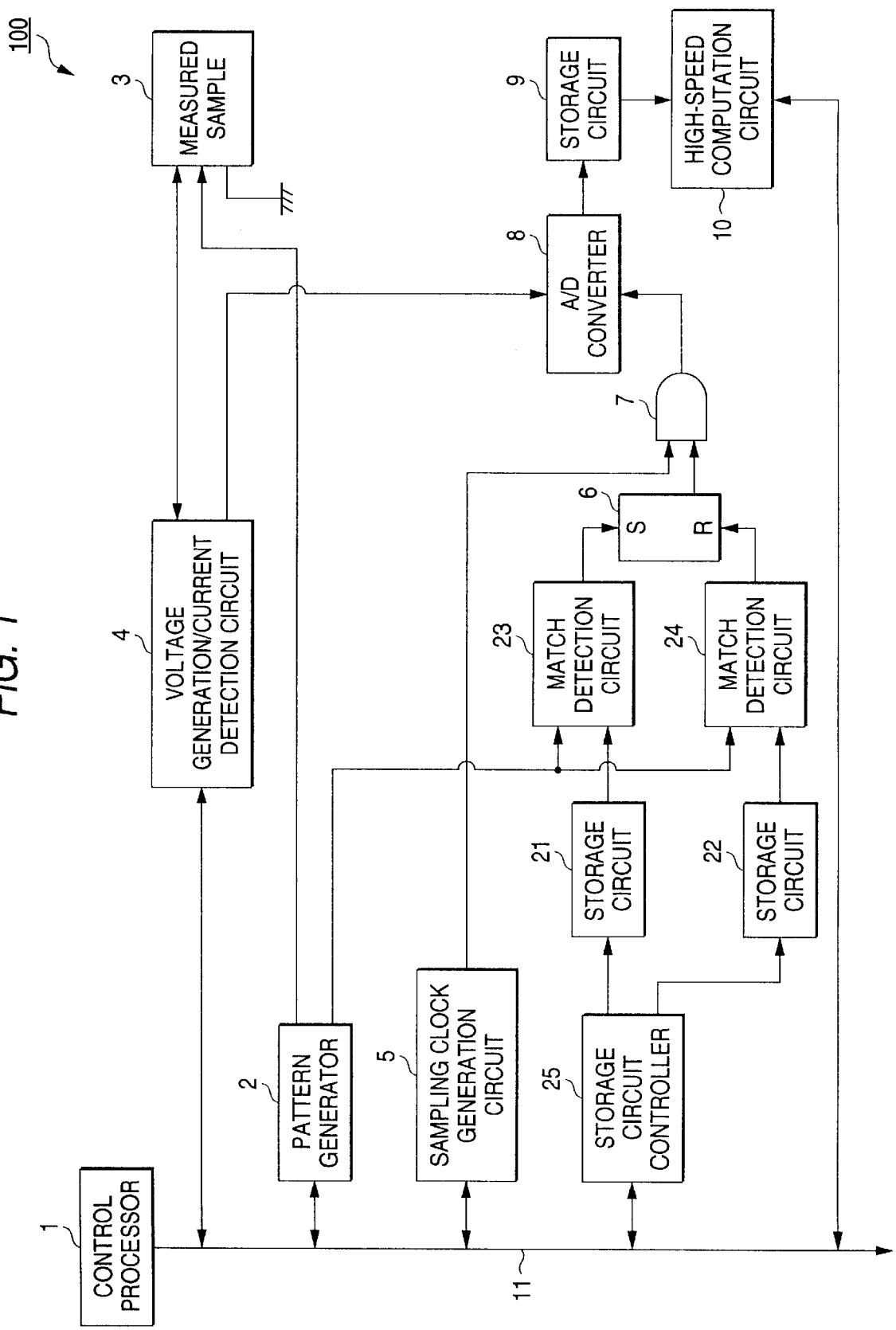
FIG. 1 is a block diagram to show a schematic configuration of an IC tester 100 as one embodiment incorporating the invention.

Referring now to FIG. 1, an embodiment of an IC tester incorporating the invention will be discussed in detail.

First, the configuration will be discussed.

Figure 2:
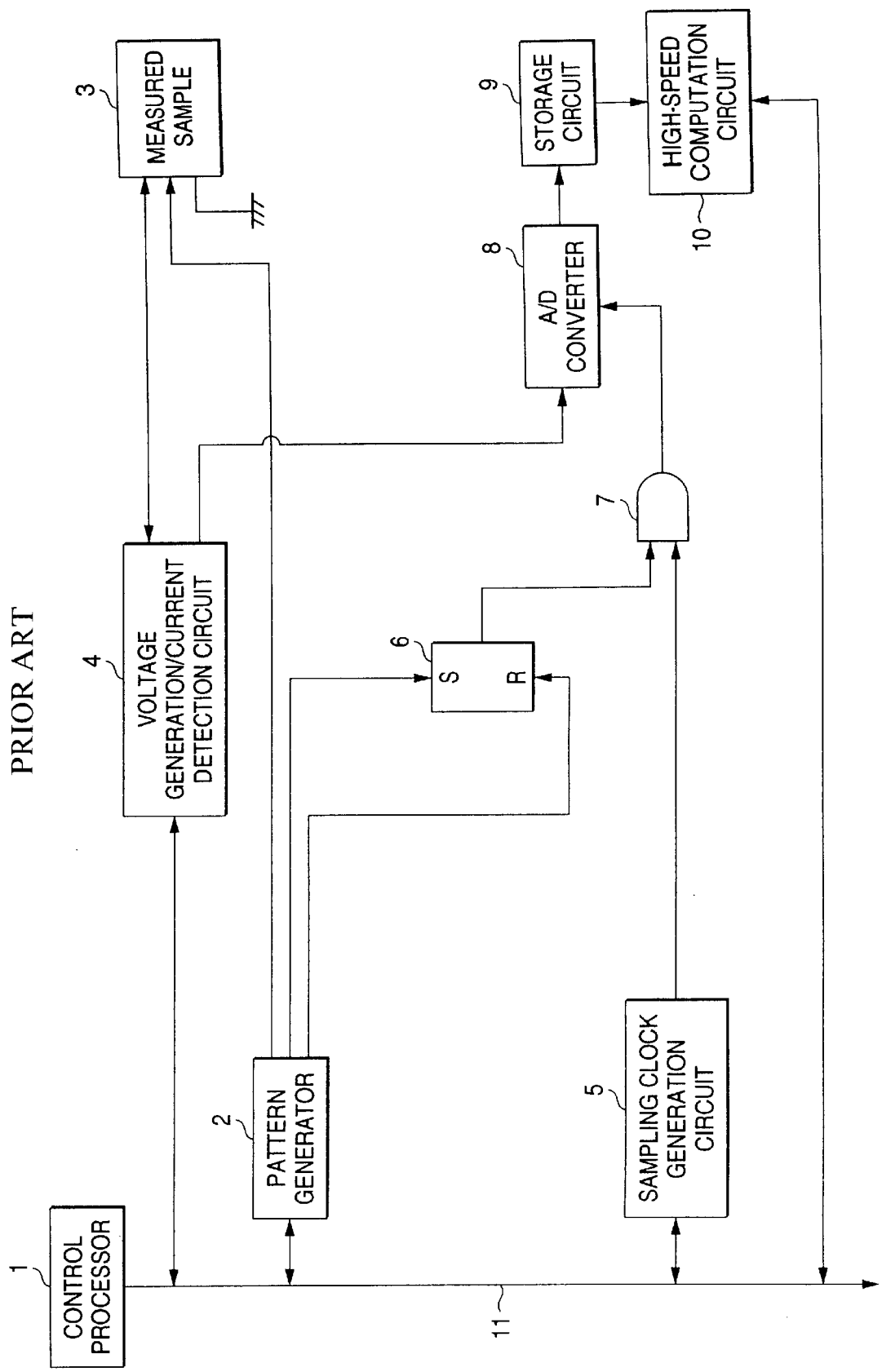
FIG. 2 is a block diagram to show a schematic configuration of an IC tester in a related art.

FIG. 1 is a block diagram to show a schematic configuration of an IC tester 100 as one embodiment incorporating the invention. In FIG. 1, the IC tester 100 is made up of a control processor 1, a pattern generator 2, a voltage generation/current detection circuit 4, a sampling clock generation circuit 5, a flip-flop 6, an AND gate 7, an AD converter 8, storage circuits 9, 21, and 22, a high-speed computation circuit 10, match detection circuits 23 and 24, and a storage circuit controller 25. The control processor 1, the pattern generator 2, the voltage generation/current detection circuit 4, the sampling clock generation circuit 5, and the storage circuit controller 25 are connected by a bus 11. Parts of the IC tester 100 identical with those of the IC tester in the related art previously described with reference to FIG. 2 are denoted by the same reference numerals in FIG. 1.

The control processor 1 sets a voltage value in the voltage generation/current detection circuit 4, outputs pattern data to the pattern generator 2, outputs a frequency control signal to the sampling clock generation circuit 5, outputs a computation control signal to the high-speed computation circuit 10, and outputs an address control signal to the storage circuit controller 25. The control processor 1 compares the frequency analysis result input from the high-speed computation circuit 10 with a predetermined standard value and determines whether or not a measured sample 3 is good.

The pattern generator 2 generates various pattern signals (digital signals) in accordance with the pattern data input from the control processor 1 and outputs the pattern signals to the measured sample 3. The pattern generator 2 outputs pattern generation address signals corresponding to the pattern signals output to the measured sample 3 to the match detection circuits 23 and 24.

The measured sample 3 is an IC to be tested and a power supply voltage is allowed to flow into the parts of the measured sample 3 in response to power supply voltage input from the voltage generation/current detection circuit 4 and the power supply voltage is changed in response to the pattern signal input from the pattern generator 2.

The voltage generation/current detection circuit 4 applies the voltage set by the control processor 1 to a power terminal of the measured sample 3. It detects a current signal responsive to the power supply current flowing into the measured sample 3 and outputs the detected current signal to the AD converter 8.

The sampling clock generation circuit 5 generates a clock signal of a frequency responsive to the frequency control signal from the control processor 1 and outputs the clock signal to the AND gate 7.

When a detection signal is input to an S terminal of the flip-flop 6 from the match detection circuit 23, the flip-flop 6 outputs "1" to the AND gate 7 and continues to output "1" until a detection signal is input to an R terminal of the flip-flop 6 from the match detection circuit 24. When the detection signal is input to the R terminal from the match detection circuit 24, the flip-flop 6 restores output to the AND gate 7 to "0" and continues to output "0" until a detection signal is input to the S terminal from the match detection circuit 23.

The AND gate 7 outputs the clock signal input from the sampling clock generation circuit 5 to the AD converter 8 only while "1" is input from the flip-flop 6. It stops outputting the clock signal to the AD converter 8 while "0" is input from the flip-flop 6.

Only while the clock signal is input from the AND gate 7, the AD converter 8 converts the current signal input from the voltage generation/current detection circuit 4 into a digital signal in synchronization with the input clock signal, and outputs the electric current converted into the digital signal to the storage circuit 9. When no clock signal is input from the AND gate 7, the AD converter 8 does not operate.

The storage circuit 9 stores the current signal converted into the digital signal input from the AD converter 8 and outputs the stored current signal to the high-speed computation circuit 10.

The high-speed computation circuit 10 conducts a frequency analysis of the current signal input from the storage circuit 9 in accordance with the computation control signal input from the control processor 1 and outputs the analysis result to the control processor 1. When a plurality of current signals are input from the storage circuit 9, the high-speed computation circuit 10 calculates the average value of the plurality of current signals in response to the computation control signal input from the control processor 1 and conducts a frequency analysis on the averaged current signal or each of the plurality of current signals.

The storage circuit 21 stores a power supply current acquisition start address in accordance with a control signal input from the storage circuit controller 25 and outputs the power supply current acquisition start address signal to the match detection circuit 23. The storage circuit 22 stores a power supply current acquisition end address in accordance with a control signal input from the storage circuit controller 25 and outputs the power supply current acquisition end address signal to the match detection circuit 24.

When the pattern generation address signal input from the pattern generator 2 and the power supply current acquisition start address signal input from the storage circuit 21 match, the match detection circuit 23 outputs a detection signal to the S terminal of the flip-flop 6.

When the pattern generation address signal input from the pattern generator 2 and the power supply current acquisition end address signal input from the storage circuit 22 match, the match detection circuit 24 outputs a detection signal to the R terminal of the flip-flop 6.

The storage circuit controller 25 stores the power supply current acquisition start address in the storage circuit 21 and the power supply current acquisition end address in the storage circuit 22 in accordance with the address control signal to the control processor 1.

Next, the operation is as follows:

First, the control processor 1 causes the storage circuit controller 25 to store the power supply current acquisition start address in the storage circuit 21 and the power supply current acquisition end address in the storage circuit 22. The control processor 1 causes the voltage generation/current detection circuit 4 to supply the power supply current to the power supply terminal of the measured sample 3 and outputs pattern data to the pattern generator 2 for generating a pattern signal. The pattern generator 2 outputs the pattern signal based on the pattern data to the measured sample 3 and outputs the pattern generation address signal responsive to the pattern signal to the match detection circuits 23 and 24.

When the match detection circuit 23 detects the match between the power supply current acquisition start address stored in the storage circuit 21 and the pattern generation address signal input from the pattern generator 2, the flip-flop 6 is set and "1" is input from the flip-flop 6 to the AND gate 7, outputting the clock signal input from the sampling clock generation circuit 5 to the AD converter 8.

On the other hand, the voltage generation/current detection circuit 4 detects an electric current flowing through the measured sample 3 and outputs the detected current signal to the AD converter 8. Only while the clock signal is input from the AND gate 7, the AD converter 8 converts the current signal input from the voltage generation/current detection circuit 4 into a digital signal in synchronization with the clock signal, and outputs the digital signal to the storage circuit 9.

Next, when the match detection circuit 24 detects the match between the pattern generation address signal input from the pattern generator 2 and the power supply current acquisition end address signal stored in the storage circuit 22, the flip-flop 6 is reset and "0" is input from the flip-flop 6 to the AND gate 7, stopping outputting the clock signal to the AD converter 8. The AD converter 8 stops output to the storage circuit 9.

That is, only while the pattern signal from the pattern generation address equal to the power supply current acquisition start address to the pattern generation address equal to the power supply current acquisition end address is input to the measured sample 3, the flip-flop 6 outputs "1" to the AND gate 7, which then outputs the clock signal input from the sampling clock generation circuit 5 to the AD converter 8, which then converts the current signal input from the voltage generation/current detection circuit 4 into a digital signal and outputs the digital signal to the storage circuit 9.

If the pattern signal input to the measured sample 3 contains a plurality of necessary test pattern signal portions, a plurality of power supply current acquisition start addresses or power supply current acquisition end addresses for specifying the necessary test pattern signal portions are stored in the storage circuit 21 or 22, whereby the AD converter 8 converts only the current signal responsive to the detected power supply current into a digital signal and outputs the digital signal to the storage circuit 9 while the necessary test pattern signal portions are input to the measured sample 3.

The storage circuit 9 stores the digital current signal input from the AD converter 8 until termination of input of the pattern signal from the pattern generator 2 to the measured sample 3. When the input of the pattern signal terminates, the storage circuit 9 outputs the stored digital current signal to the high-speed computation circuit 10. The high-speed computation circuit 10 conducts a frequency analysis of the digital current signal input from the storage circuit 9 and outputs the analysis result to the control processor 1. The control processor 1 determines whether or not the measured sample 3 is good based on the analysis result input from the high-speed computation circuit 10.

As described above, the control processor 1 causes the storage circuit controller 25 to store the power supply current acquisition start address in the storage circuit 21 and the power supply current acquisition end address in the storage circuit 22. The pattern generator 2 outputs the pattern signal to the measured sample 3 and outputs the pattern generation address signal of the pattern signal to the match detection circuits 23 and 24. When the power supply current acquisition start address input from the storage circuit 21 and the pattern generation address signal match, the match detection circuit 23 inputs the detection signal to the S terminal of the flip-flop 6. When the power supply current acquisition end address input from the storage circuit 22 and the pattern generation address signal match, the match detection circuit 24 inputs the detection signal to the R terminal of the flip-flop 6.

Thus, the flip-flop 6 outputs "1" to the AND gate 7 at the time interval between the instant at which the detection signal is input to the S terminal and the instant at which the detection signal is input to the R terminal, namely, between the pattern generation address signal matching the power supply current acquisition start address and matching the power supply current acquisition end address. The AND gate 7 outputs the clock signal input from the sampling clock generation circuit 5 to the AD converter 8 only while "1" is input from the flip-flop 6, and the AD converter 8 converts the current signal input from the voltage generation/current detection circuit 4 into a digital signal and outputs the digital signal to the storage circuit 9 only while the clock signal is input from the AND gate 7.

The storage circuit 9 outputs the current signal converted into the digital signal input from the AD converter 8 to the high-speed computation circuit 10. The high-speed computation circuit 10 conducts a frequency analysis of the current signal and outputs the analysis result to the control processor 1. The control processor 1 determines whether or not the measured sample 3 is good based on the analysis result.

Therefore, a frequency analysis can be conducted on the power supply current fluctuation of the measured sample 3 based on the pattern signal portions specified by the power supply current acquisition start address and the power supply current acquisition end address. Thus, for example, if a pattern for initializing the measured sample 3 must be contained in the beginning of the pattern signal, a frequency analysis of only the power supply current fluctuation of the measured sample 3 based on the test pattern signal excluding the pattern portion for initializing the measured sample 3 can also be conducted. Consequently, the program involved in the IC test can also be developed easily.

The storage circuit 21 or 22 can store a plurality of power supply current acquisition start addresses or power supply current acquisition end addresses. Thus, a pattern signal is generated only once, whereby a frequency analysis of the power supply current fluctuation of the measured sample 3 based on the pattern signal portions required for of test contained in the pattern signal can be conducted.

Thus, for example, one pattern signal comprising n patterns for initializing the measured sample 3 and n patterns required for testing in succession is generated only once, whereby only n current signals based on the test pattern portions can be stored in the storage circuit 9. Thus, if the n current signals are averaged to remove the noise component, the pattern signal input to the measured sample 3 need not be changed and whether or not the measured sample 3 is good can be determined more easily based on the frequency analysis result of the power supply current of the measured sample 3.

For example, if the pattern signal must be changed for each of the circuit blocks of the measured sample 3, the pattern signal containing the pattern signal responsive to each circuit block is generated only once, whereby the current signal responsive to the pattern signal varying from one circuit block to another can be stored in the storage circuit 9, so that whether or not the measured sample 3 is good can be determined more easily based on the frequency analysis result of the power supply current of the measured sample 3 without changing the pattern signal input to the measured sample 3.

The frequency of the clock signal output from the sampling clock generation circuit 5 can be changed whenever necessary depending on the specifications of the IC as the measured sample 3, the test conditions, etc., and the combination and arrangement of parts may be resorted to without departing from the spirit and the scope of the invention.

A frequency analysis of the power supply current of an IC responsive to the pattern specified by the start address and the end address in a pattern signal input to the IC can be conducted. Thus, for example, if a pattern for initializing the IC must be contained in the beginning of the pattern signal input to the IC, a frequency analysis of only the power supply current fluctuation of the IC responsive to the test pattern portion excluding the pattern portion for initializing the IC can also be conducted, so that the pattern input to the IC need not be changed and the test can be made more easily. The test program can be developed more easily.

If the pattern signal contains a plurality of pattern signal portions required for the test, the plurality of pattern signal portions can be specified and the power supply currents of the IC based on the pattern signal portions required for test can be stored for conducting a frequency analysis.

Thus, for example, if the pattern signal must be changed for each of the circuit blocks making up the IC, the pattern signal containing all of the pattern signals responsive to the circuit blocks is input to the IC only once, whereby the power supply current responsive to the pattern signal varying from one circuit block to another can be stored in the storage circuit 9 and whether or not the IC is good can be determined based on the frequency analysis result, so that test can be carried out more easily without changing the pattern signal input to the IC.

For example, if a frequency analysis is conducted after removal of the noise component of the power supply currents detected by storing and averaging a plurality of power supply currents based on the same test pattern, one pattern signal comprising a plurality of patterns for initializing the IC and a plurality of patterns required for testing in succession is input to the IC only once, whereby a plurality of only power supply currents based on the test pattern portions can be stored, so that test can be carried out more easily without changing the pattern signal input to the IC.

What is claimed is:

1. An IC tester for conducting a frequency analysis of a power supply current fluctuating in response to a test pattern signal input to an IC and testing the IC, said IC tester comprising:

a processor to generate address control signals and pattern data signals;

circuitry to detect power supply current from the IC in response to the test pattern signal input to the IC;

pattern address storage means for storing a start address and an end address based on the address control signals;

power supply current storage means for storing only power supply current from the IC that is detected while a pattern specified by the start address and the end address is input to the IC;

frequency analysis means for conducting a frequency analysis of the power supply current stored in said power supply current storage means; and said processor to determine whether or not the IC is good based on an analysis result of said frequency analysis means.

2. The IC tester as claimed in claim 1, further comprising:

pattern address generation means, coupled to an output of said processor, for generating an address signal of the test pattern signal input to the IC based on the pattern data signals; and detection means, coupled to outputs of the pattern address storage means and the pattern address means, for detecting a match between the address signal generated by said pattern address generation means and the start address and the end address stored in said pattern address storage means, wherein said power supply current storage means stores only power supply current detected in a time interval from a time when said detection means detects the match between the address signal and the start address until a time when said detecting means detects the match between the address signal and the end address.

3. The IC tester as claimed in claim 2 wherein said pattern address storage means stores a plurality of start addresses and a plurality of end addresses.

4. The IC tester as claimed in claim 1 wherein said pattern address storage means stores a plurality of start addresses and a plurality of end addresses.

5. An IC test method for conducting a frequency analysis of a power supply current fluctuating in response to a test pattern signal input to an IC and testing the IC, said IC test method comprising the steps of:

storing a start address and an end address of the test pattern signal input to the IC;

storing only power supply current from the IC that is detected while the pattern specified by the start address and the end address is input to the IC;

conducting a frequency analysis of the stored power supply current; and determining whether or not the IC is good based on an analysis result of said frequency analysis.

6. The IC test method as claimed in claim 5, further comprising the additional steps of:

generating an address signal of the test pattern signal input to the IC; and detecting a match between the address signal and the start address and the end address, wherein only power supply current detected in a time interval from a time when the match between the address signal and the start address is detected until a time when the match between the address signal and the end address is detected.

7. The IC test method as claimed in claim 6, wherein storing a start address and an end address includes storing a plurality of start addresses and a plurality of end addresses.

8. The IC test method as claimed in claim 5, wherein storing a start address and an end address includes storing a plurality of start addresses and a plurality of end addresses.

* * * * *